United States Patent [19]

Jones et al.

[11] Patent Number: 4,754,176

[45] Date of Patent: Jun. 28, 1988

[54] MINIATURE HIGH VOLTAGE SOLID STATE RELAY

[75] Inventors: Franklin B. Jones, Baltimore; Robert W. Wachtler, III, Annapolis, both of Md.

[73] Assignee: The United States of America as represented by the Secretary of the Air Force, Washington, D.C.

[21] Appl. No.: 947,574

[22] Filed: Nov. 28, 1986

[51] Int. Cl.$^4$ .......................................... H03K 17/687
[52] U.S. Cl. ..................................... 307/571; 307/584; 307/270
[58] Field of Search ............................ 328/67, 77, 79; 307/570, 571, 574, 584, 601; 333/24.1; 323/282

[56] References Cited

U.S. PATENT DOCUMENTS

| | | | |
|---|---|---|---|
| 3,502,910 | 3/1970 | Johanson-Brown | 307/641 |
| 4,367,421 | 1/1983 | Baker | 307/570 |
| 4,394,590 | 7/1983 | Honda | 307/584 |
| 4,425,518 | 1/1984 | Milberger | 307/571 |
| 4,438,356 | 3/1984 | Fleischer | 307/571 |
| 4,455,526 | 6/1984 | Miller | 323/282 |
| 4,469,961 | 9/1984 | Milberger et al. | 307/270 |

FOREIGN PATENT DOCUMENTS

| | | | |
|---|---|---|---|
| 1126989 | 9/1968 | United Kingdom | 307/252 L |
| 1176079 | 1/1970 | United Kingdom | 307/252 L |

Primary Examiner—Stanley D. Miller
Assistant Examiner—B. P. Davis
Attorney, Agent, or Firm—William G. Auton; Donald J. Singer

[57] ABSTRACT

High voltage is connected and disconnected in less than a microsecond from a high voltage power supply to a radar transmitter using a solid state relay. The solid state relay supplies this high voltage using multiple power MOSFETs, which are serially-connected between the source and the load. The gate of each power MOSFET is simultaneously triggered by trigger circuits which, in turn, are activated and coupled by a single turn transformer. The transformer is driven by a pair of field effect transistors, which are activated by a pair of open collector comparators. The open collector comparators only activate when they receive a signal indicating that the radar transmitter should transmit a waveform.

1 Claim, 2 Drawing Sheets

MINIATURE HIGH VOLTAGE SOLID STATE RELAY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to high voltage switching circuits, and more specifically to a solid state relay which is capable of switching high power in nanoseconds.

The generation of adequate radio frequency (RF) power is an important function of the transmitter of any radar system. This is because the required transmitter power varies as the fourth root of the range of the radar, if all other factors are constant. To double the range of a radar system, the power has to be increased 16-fold.

Conventional radar systems use one or more traveling wave tube (TWT) amplifiers to output RF signals at commonly used frequency bands at high power. Medium power is, in the present context, defined as electrical power of around 100 watts, and high-power is considered to be electrical power at 1-10kw and above.

While high-voltage power supply units are capable of supplying electrical voltage with the proper magnitudes, this voltage must also be switched on and off, with switching times which may be in microseconds. Mechanical switching devices have inherent limitations in their ability to connect and disconnect the high voltage power supply to the TWT.

Solid state relays appear to be attractive candidates to replace mechanical switches, since they can provide a much faster and smoother connection and disconnect of power than mechanical devices. In the past, however, solid state relays have been limited to the voltage standoff available in a single device. This voltage standoff may be insufficient for the high power needs of a radar transmitter.

The task of providing a solid state relay capable of supplying high power with fast switching speeds is alleviated, to some extent, by the systems described in the following U.S. Patents, the disclosures of which are incorporated herein by reference:

U.S. Pat. No. 4,367,421, issued to Baker;
U.S. Pat. No. 4,394,590, issued to Honda;
U.S. Pat. No. 4,425,518, issued to Milberger;
U.S. Pat. No. 4,438,356, issued to Fleischer; and
U.S. Pat. No. 4,455,526, issued to Miller.

A solid state relay employing metal oxide semiconductor field effect transistor (MOSFET) power switching transistors is disclosed in Fleischer. The MOSFETs are switched by applying a potential to their gates from an oscillator 10 by way of a control circuit and transformer. A plurality of series connected transistor switches is shown in both Baker and Honda. The Honda patent indicates that the transistors operate simultaneously.

Miller shows a switching regulator having both ON and OFF transformer drives. A very short ON drive pulse charges the capacitance at the gate of the switching transistor and the OFF drive circuit shunts the switching transistor gate-to-source for a short interval to remove the charge. Milberger shows a diode gate circuit for transistors driven through a transformer.

While the prior art is instructive, a need remains for a solid state relay capable of connecting and disconnecting high power at high speeds. The present invention is intended to satisfy that need.

SUMMARY OF THE INVENTION

This invention is a solid state relay developed as a direct replacement for a mechanical relay used to connect a driver traveling wave tube to its high voltage cathode supply. One embodiment uses eight MOSFET transistors connected in series and driven by ON and OFF triggers through single turn transformers. A diode gate circuit is used with a single 200 nanosecond ON pulse to charge the gates, turning the FETS on. Simultaneous turn on is guaranteed by the close transformer coupling. Refresh pulses are needed once each millisecond to keep the gate capacitances charged. The relay is capable of switching 4000 volts in 200 nanoseconds and occupies a total of three cubic inches.

It is an object of the present invention to provide a means of connecting and disconnecting high power, from a high voltage power supply, to one or more traveling wave tubes.

It is another object of the present invention to connect and disconnect high power at high speed with switching times occurring within microseconds and faster.

It is another object of the invention to supply high power with a solid state relay.

These objects, together with other objects, features and advantages of the invention will become more readily apparent from the following detailed description when taken in conjunction with the accompanying drawing wherein like elements are given like reference numerals throughout.

DETAILED DESCRIPTION OF THE PREFERRED EMBODIMENT

The present invention is a solid state relay capable of connecting and disconnecting high power at high speeds. As mentioned above, medium power is, in the present context, defined as electrical power of around 100 watts, and high-power is considered to be electrical power at 1-10 kw and above. High switching speeds are defined as ranging from 100 nanoseconds to around 10 microseconds.

Figure 1:
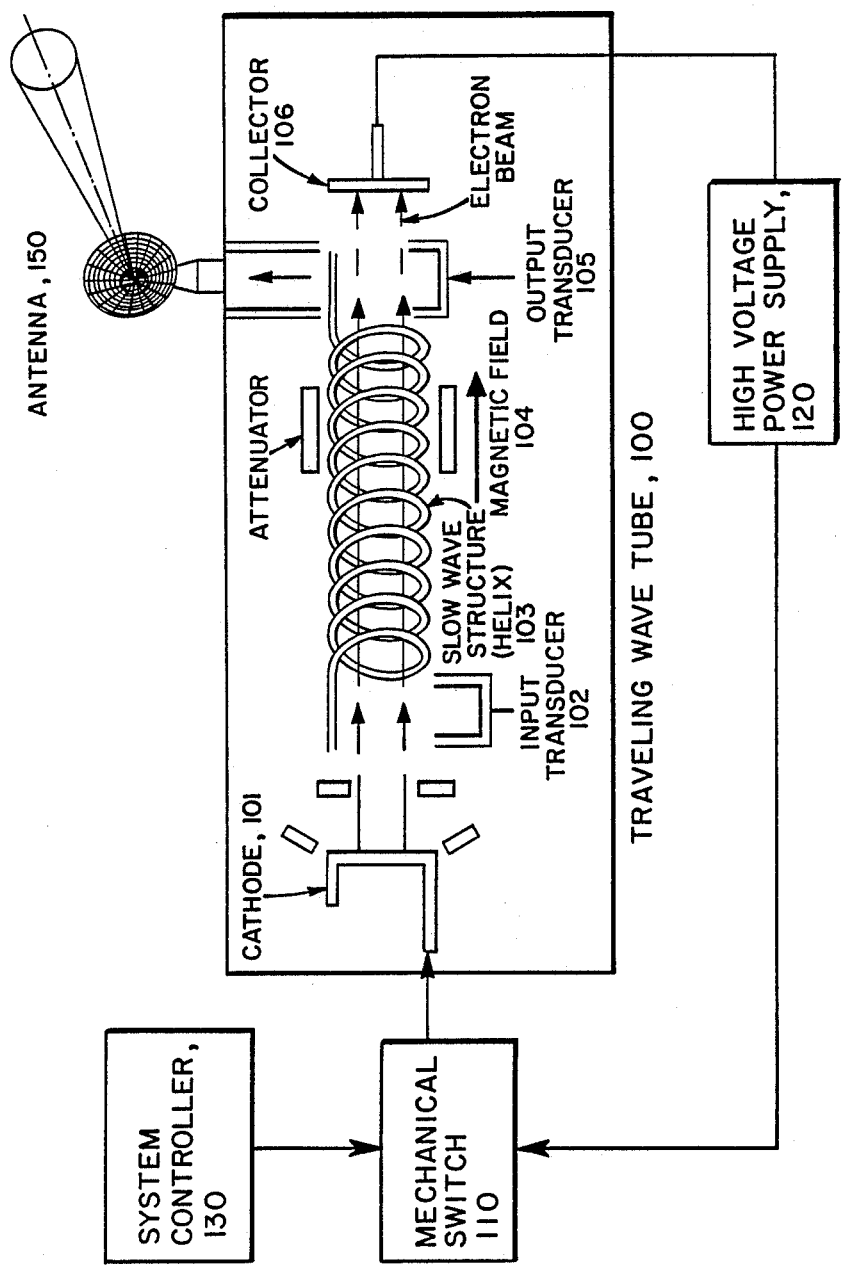
FIG. 1 is a schematic of a prior art radar transmitter system.

The reader's attention is now disclosed towards FIG. 1, which is a schematic which represents a conventional radar transmitter system. In the system of FIG. 1, a mechanical switch 110 is used to connect and disconnect voltage from the high voltage power supply 120 to the cathode 101 of a traveling wave tube 100. Electrons emitted by the cathode 101 of the traveling wave tube 100 are focused into a beam and pass through the RF interaction region. After delivering their d-c energy to the RF field, the electrons are removed by the collector electrode 106. The RF signal to be amplified enters via the input transducer 102 and propagates along the helix 103. The velocity of propagation of electromagnetic energy is slowed down by the helix 103 and is nearly equal to the velocity of the electron beam. For this reason, it is sometimes called a slow-wave structure, or a periodic delay line. In the helical line the wave travels along the wire with about the sped of light but the velocity of propagation in the direction of the beam is somewhat less. For example, if the wire is 13 times as long as the axial length of the helix, the wave will travel along the beam with one-thirteenth the speed of light, and the electrons will be in synchronism with the wave if they are accelerated by about 1,500 volts. The synchronism between the electromagnetic wave and the electrons results in a cumulative interaction which transfers energy from the d-c beam to the RF wave, causing the RF wave to be amplified.

The RF signal, when applied to the input transducer 102 of the traveling wave tube, velocity-modulates the electron beam. The velocity modulation is transformed into density modulation (bunches) after traveling a short distance down the traveling wave tube 100. Finally, the amplified RF signal is conducted by the output transducer 105 to the antenna 150, which radiates it in the form of the waveforms.

In the system of FIG. 1, the mechanical switch 110 connects the high voltage power supply 120 to the cathode 101 of the TWT when the antenna 150 is to radiate waveforms and disconnects the high voltage power supply otherwise. Typical waveforms can include a variety of pulses and chirped pulses which require the mechanical switch to connect and disconnect, with switching times on the order of a few microseconds. As mentioned above, this is an excessive requirement for a mechanical switch. As also mentioned, solid state relays are generally limited to the voltage standoff produced by a single amplifier. Additionally, the complications of floating drive and simultaneous switching have made series operation of multiple solid state relays impractical in a limited space.

Figure 2:
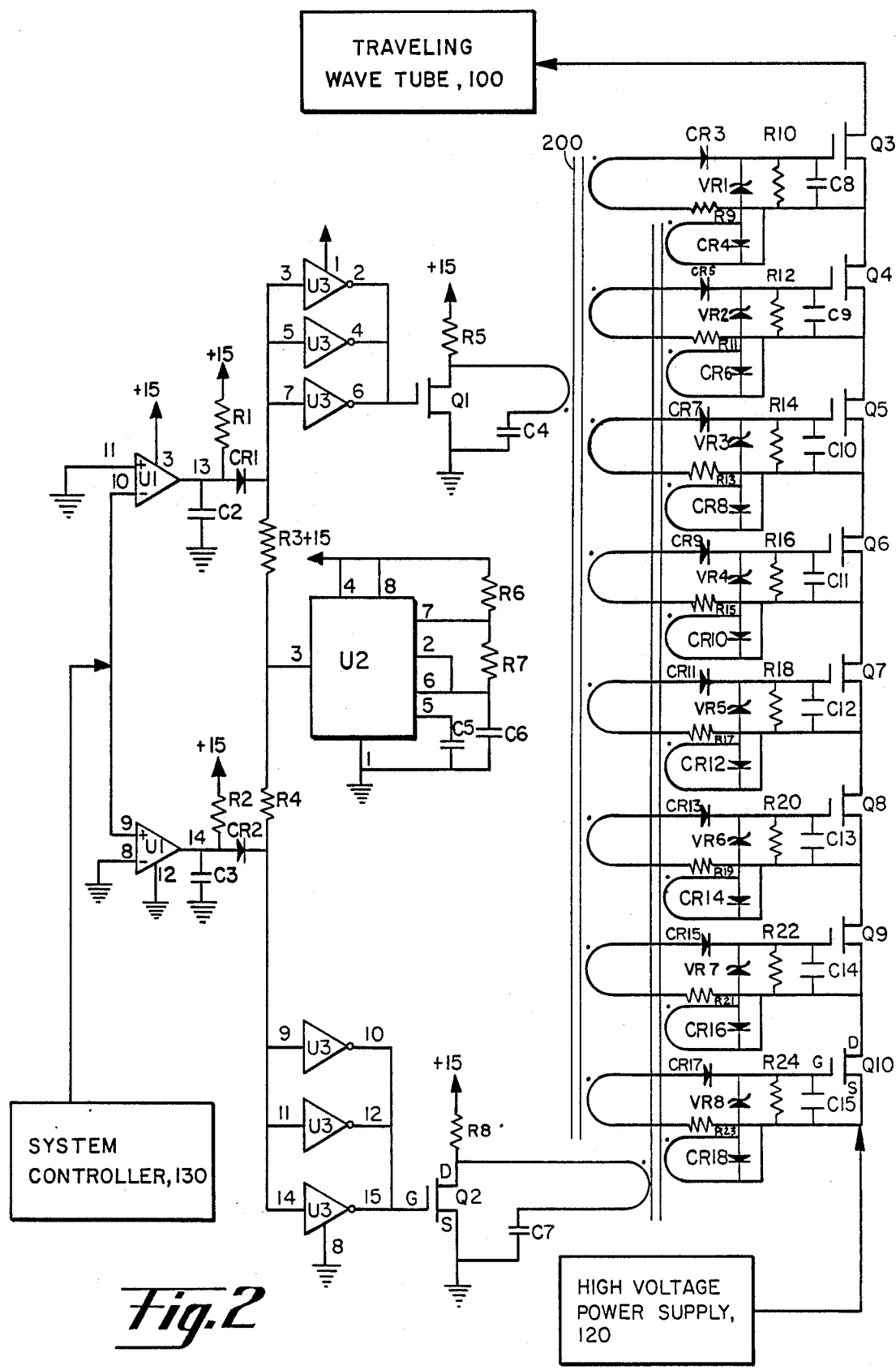
FIG. 2 is an electrical schematic of an embodiment of the present invention.

The reader's attention is now directed toward FIG. 2, which is an electrical schematic of the present invention. The system of FIG. 2 is a miniature high voltage solid state relay which is capable of switching 4,000 volts in 200 nanoseconds. In operation, it can by used to replace the mechanical switch 110 of FIG. 1.

The system of FIG. 2 uses eight power MOSFET transistors Q3-Q10 in an electrical series to connect and disconnect power from the high voltage power supply 120 to the TWT 100, as required by the system controller 130. Note that FIG. 2 is just intended as an example of the present invention. Each of the power MOSFETS Q3-Q10 outputs a standoff of 500 volts each, for a total of 4,000 volts, but a different number of power transistors could be used for different power requirements.

The eight power MOSFETS Q3-Q10 are driven simultaneously by ON and OFF trigger circuits, which are coupled together through a single turn transformer 200. This transformer thereby provides a single timing signal to all eight MOSFETs Q3-Q10 with a frequency (or switching rate) of up to 100 $kH_z$.

The single turn transformer 200 is coupled with and driven by two field effect transistors (FETS) Q1 and Q2, which are each driven, in turn, by two sets of complementary metal oxide semiconductors (CMOS) U3. The metal oxide semiconductors U3 are capable of receiving and conducting both a 200 nanosecond ON pulse to the FETs, Q1 and Q2 and another signal which is discussed below.

The system of FIG. 2 includes a timer circuit U2. The purpose of the timer is to provide a refresh pulse once each millisecond, which is conducted by the CMOS sets U3 to the gates of the FETs Q1 and Q2. The purpose of this refresh pulse is to keep the gate capacitances of FETs Q1 and Q2 charged. Accordingly, the timer circuit can be an oscillator which produces a pulse once every millisecond.

The two sets of complementary metal oxide semiconductors U3 are, as mentioned above, capable of conducting a 200 nanosecond ON pulse to FETs Q1 and Q2. As indicated in FIG. 2, they receive the ON pulse from two open collector comparators U1. These comparators U1 produce the ON pulse whenever they receive an input signal from the system controller 130. Through the chain of causality described above, the ON pulse is conducted through the single turn transformer 200 to simultaneously enable the eight power MOSFETs to connect the high voltage power supply 120 to the TWT 100. Accordingly, the system controller will only send a signal to the comparator circuit U1 when it wants the radar to transmit a waveform. In the absence of an ON pulse, the MOSFETs Q3-Q10 disconnect the high voltage power supply 120 from the TWT 100. The high voltage solid state relay of FIG. 2 is therefore able to provide a total of 4,000 volts with a switching rate of 100 $kH_z$ when so required by the system controller.

As mentioned above, the system of FIG. 2 is intended as an example of the present invention. Variations can include the selection of a different number of power MOSFETs, and the use of the diode gate of the above-cited Milberger reference as part of the trigger mechanism.

While the invention has ben described in its presently preferred embodiment it is understood that the words which have been used are words of description rather than words of limitation and that changes within the purview of the appended claims may be made without departingly from the scope and spirit of the invention in its broader aspects.

What is claimed is:

1. A high voltage solid state relay which is capable of connecting and disconnecting a high voltage source to a load in response to command signals it receives from a system controller, said high voltage solid state relay comprising:

a plurality of power transistors which are electrically connected in a series, said plurality of power transistors including a first transistor and a last transistor, said first transistor having its source terminal electrically connected with said high voltage source and its drain terminal connected with a source terminal of another of said power transistors, said last transistor having its drain terminal connected with said load to supply high voltage to it, said plurality of power transistors each simultaneously receiving a trigger signal to their gate terminals to cause them to supply said high voltage to said load, said plurality of power transistors disconnecting said high voltage source from said load when not receiving said trigger signal;

a plurality of trigger circuits, each being electrically connected with one of said plurality of power transistors and simultaneously sending said trigger signal when activated;

a transformer which is electrically connected with and which electrically couples all of said plurality of trigger circuits, said transformer thereby simultaneously acitiviating said plurality of trigger circuits when receiving an ON pulse;

a second transistor, which is connected with and inputs said ON pulse to said transformer, said second transistor having a gate which receives an input pulse to cause it to produce said ON pulse;
an amplifier which is electrically connected with said second transistor and produces said input pulse for the gate of said second transistor by receiving and amplifying said command signals from said system controller; and
a timing circuit which charges gate capacitance of the second transistor by periodically sending a refresh pulse to the gate of the second transistor.

* * * * *